(12) United States Patent
Satoh

(10) Patent No.: US 7,656,234 B2
(45) Date of Patent: Feb. 2, 2010

(54) CIRCUIT AND OSCILLATING APPARATUS

(75) Inventor: Hiroyuki Satoh, Tokyo (JP)

(73) Assignee: Advantest Corporation (JP)

( * ) Notice: Subject to any disclaimer, the term of this patent is extended or adjusted under 35 U.S.C. 154(b) by 118 days.

(21) Appl. No.: 11/874,926

(22) Filed: Oct. 19, 2007

(65) Prior Publication Data
US 2009/0102521 A1    Apr. 23, 2009

(51) Int. Cl.
*H03L 7/085* (2006.01)
(52) U.S. Cl. .................. 331/1 A; 327/115; 327/117
(58) Field of Classification Search ........... 331/1 A; 327/115, 118, 208; 326/126
See application file for complete search history.

(56) References Cited

U.S. PATENT DOCUMENTS

| | | | | |
|---|---|---|---|---|
| 6,072,850 | A * | 6/2000 | Ueno | 377/47 |
| 6,157,693 | A * | 12/2000 | Jayaraman | 377/47 |
| 6,385,276 | B1 | 5/2002 | Hunt, Jr. et al. | |
| 6,753,703 | B2 * | 6/2004 | Chu | 326/126 |
| 2003/0141912 | A1 * | 7/2003 | Sudjian | 327/208 |
| 2005/0116258 | A1 * | 6/2005 | Yamagishi et al. | 257/222 |
| 2006/0135108 | A1 * | 6/2006 | De Ranter et al. | 455/313 |

FOREIGN PATENT DOCUMENTS

| | | |
|---|---|---|
| JP | S62-236211 | 10/1987 |
| JP | 2001-136059 | 5/2001 |
| JP | 2003-188716 | 7/2003 |

* cited by examiner

*Primary Examiner*—Joseph Chang
*Assistant Examiner*—Jeffrey Shin
(74) *Attorney, Agent, or Firm*—Chen Yoshimura LLP

(57) ABSTRACT

A circuit includes a logic circuit containing a first transistor and a second transistor which are connected in series to each other between a high power supply and a low power supply in such a manner that an emitter of one of the first and second transistors is connected to a collector of the other of the first and second transistors. The first transistor is positioned closer to the high power supply, and the second transistor is positioned closer to the low power supply. The logic circuit operates in accordance with voltages input into bases of the first and second transistors. The circuit further includes a current amplifying circuit containing a third transistor whose collector is connected to one of the high and low power supplies, whose emitter is connected to the other of the high and low power supplies, and whose base is connected to an output from the logic circuit. The current amplifying circuit amplifies a current of a logic signal from the logic circuit and feeds, from the emitter of the third transistor, the current-amplified logic signal back to the base of the second transistor.

7 Claims, 8 Drawing Sheets

| MC | CURRENT CYCLE | | | NEXT CYCLE | | |
|---|---|---|---|---|---|---|
|  | FF100a | FF100b | FF125 | FF100a | FF100b | FF125 |
| 0 | 0 | 0 | 1 | 1 | 0 | 1 |
|  | 0 | 1 |  | 0 | 0 |  |
|  | 1 | 0 |  | 1 | 1 |  |
|  | 1 | 1 |  | 0 | 1 |  |

| MC | CURRENT CYCLE | | | NEXT CYCLE | | |
|---|---|---|---|---|---|---|
| | FF100a | FF100b | FF125 | FF100a | FF100b | FF125 |
| 1 | 0 | 0 | 0 | 1 | 0 | 0 |
| | 0 | 0 | 1 | 1 | 0 | 0 |
| | 0 | 1 | 0 | 1 | 0 | 1 |
| | 0 | 1 | 1 | 0 | 0 | 1 |
| | 1 | 0 | 0 | 1 | 1 | 0 |
| | 1 | 0 | 1 | 1 | 1 | 0 |
| | 1 | 1 | 0 | 1 | 1 | 1 |
| | 1 | 1 | 1 | 0 | 1 | 1 |

CIRCUIT AND OSCILLATING APPARATUS

BACKGROUND

1. Technical Field

The present invention relates to a circuit and an oscillating apparatus. More particularly, the present invention relates to a circuit including therein a logic circuit and a current amplifying circuit that amplifies the current of the signal output from the logic circuit and feeds the current-amplified signal back to the logic circuit, and to an oscillating apparatus which uses the above-mentioned circuit as a frequency dividing circuit.

2. Related Art

In a conventional logic gate circuit constituting a logic circuit, transistors are provided as switches between a high power supply with a relatively high potential and a low power supply with a relatively low potential. Here, the transistors may be field effect transistors (FETs), MOSFETs, high electron mobility transistors (HEMTs) or the like. The logic gate circuit outputs a logic signal in accordance with an input signal, for example, by connecting one of the high and low power supplies to the output terminal of the logic gate circuit depending on whether the switches are turned on or off.

Here, a logic gate circuit including therein two or more input terminals is provided with two or more transistors the bases of which are connected to the input terminals. Depending on the type of the logic operation which is desired to be performed by the logic gate circuit, the transistors may be connected in series to each other between the high and low power supplies in such a manner that the emitter of one of the transistors is connected to the collector of the other of the transistors. Take an example of a NAND circuit with two input terminals. The NAND circuit outputs the logic value "0" to the output terminal when the two inputs both indicate the logic value "1". Therefore, the NAND circuit may be configured according to one embodiment in such a manner that the two transistors are connected in series to each other between the high and low power supplies and the bases of the transistors are connected to the input terminals. In this NAND circuit, when the two inputs both indicate the logic value "1", the two transistors are turned on so as to connect the low power supply to the output terminal. As a result, the NAND circuit outputs the logic value "0".

Here, it is necessary to generate a voltage of, for example, 0.9V between the base and the emitter in order to cause the transistors to operate. This necessity limits the number of transistors which can be connected in series between the high and low power supplies. In view of this, it is desired to realize a high-speed logic circuit with it being possible to keep the number of transistors which can be connected in series between the high and low power supplies equal to or smaller than a predetermined number.

SUMMARY

Therefore, it is an object of an aspect of the present invention to provide a circuit and an oscillating apparatus, which are capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary circuit may include a circuit including a logic circuit that includes therein a first transistor and a second transistor which are connected in series to each other between a high power supply and a low power supply in such a manner that an emitter of one of the first and second transistors is connected to a collector of the other of the first and second transistors. Here, the first transistor is positioned closer to the high power supply and the second transistor is positioned closer to the low power supply. The logic circuit operates in accordance with voltages input into respective bases of the first and second transistors. The circuit further includes a current amplifying circuit that includes therein a third transistor whose collector is connected to one of the high and low power supplies, whose emitter is connected to the other of the high and low power supplies, and whose base is connected to an output from the logic circuit. The current amplifying circuit amplifies a current of a logic signal output from the logic circuit and feeds, from the emitter of the third transistor, the current-amplified logic signal back to the base of the second transistor.

According to a second aspect related to the innovations herein, one exemplary oscillating apparatus may include an oscillating apparatus including an oscillating circuit that outputs an oscillating signal in accordance with a frequency control signal, a frequency dividing circuit that outputs a frequency divided signal obtained by dividing a frequency of the oscillating signal, and a phase comparing circuit that compares the frequency divided signal and a reference clock to each other in terms of phase in order to detect a phase difference, and supplies to the oscillating circuit the frequency control signal to bring the detected phase difference closer to a predetermined value. Here, the frequency dividing circuit includes a logic circuit that includes therein a first transistor and a second transistor which are connected in series to each other between a high power supply and a low power supply in such a manner that an emitter of one of the first and second transistors is connected to a collector of the other of the first and second transistors. Here, the first transistor is positioned closer to the high power supply and the second transistor is positioned closer to the low power supply. The logic circuit operates in accordance with voltages input into respective bases of the first and second transistors and outputs the frequency divided signal obtained by dividing the frequency of the oscillating signal. The frequency dividing circuit further includes a current amplifying circuit that includes therein a third transistor whose collector is connected to one of the high and low power supplies, whose emitter is connected to the other of the high and low power supplies, and whose base is connected to an output from the logic circuit. The current amplifying circuit amplifies a current of the frequency divided signal and feeds, from the emitter of the third transistor, the current-amplified frequency divided signal back to the base of the second transistor.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, an aspect of the present invention will be described through some embodiments. The embodiments do not limit the invention according to the claims, and all the combinations of the features described in the embodiments are not necessarily essential to means provided by aspects of the invention.

Figure 1:
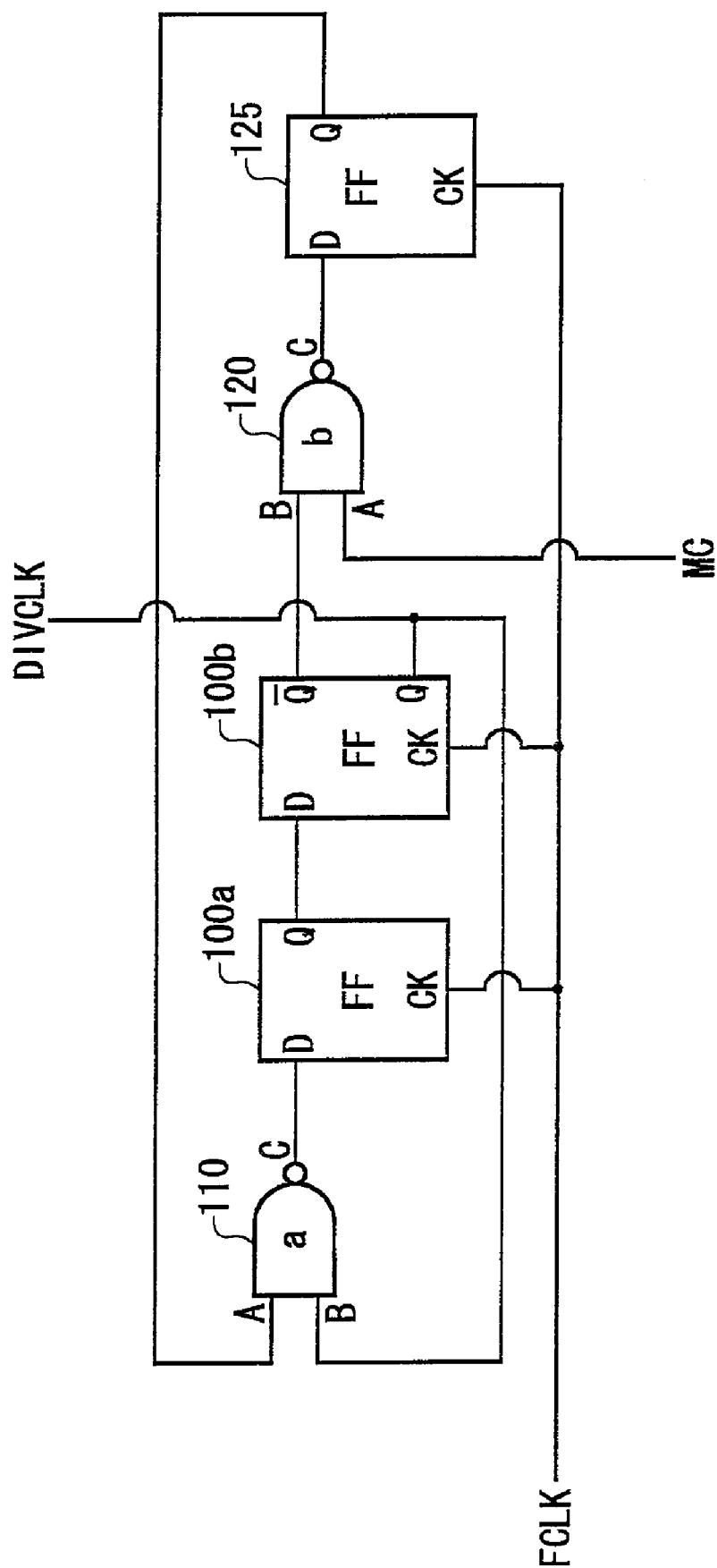
FIG. 1 illustrates an example of a frequency dividing circuit 10 relating to an embodiment of the present invention.

FIG. 1 illustrates an example of a frequency dividing circuit 10 relating to an embodiment of the present invention. The frequency dividing circuit 10 is shown as an example of a circuit and a frequency dividing circuit relating to the present invention. The frequency dividing circuit 10 receives a clock signal FCLK and a frequency dividing ratio control signal MC (Modulus Control), divides the frequency of the clock signal FCLK in accordance with the frequency dividing ratio designated by the frequency dividing ratio control signal MC, and outputs the resulting signal as a frequency-divided signal DIVCLK. To be more specific, the frequency dividing circuit 10 is a dual modulus prescaler. The frequency dividing circuit 10 divides the frequency of the clock signal FCLK input thereto in accordance with one of a first frequency dividing ratio and a second frequency dividing ratio which is selected by the frequency dividing ratio control signal MC input thereto.

The frequency dividing circuit 10 includes therein a flip-flop (FF) 125, flip-flops 100a-100b, a NAND gate 120 and a NAND gate 110. The flip-flop 125 and flip-flops 100a-100b each obtain the logic value input into the input terminal D at the timing indicated by the clock signal FCLK (for example, at the timing indicated by the rising edge), output the obtained logic value from the output terminal Q and output the inverted value of the obtained logic value from the output terminal /Q. The flip-flop 125 is shown as an example of a first flip-flop relating to the present invention, and the flip-flops 100a-100b are shown as an example of a second flip-flop relating to the present invention.

The NAND gates 120 and 110 each receive two input signals via the two input terminals, and output a logical NAND between the two input signals via the output terminal. The NAND gate 120 is shown as an example of a first logic gate circuit relating to the present invention, and the NAND gate 110 is shown as an example of a second logic gate circuit relating to the present invention.

The NAND gate 120 is connected at one of the input terminals thereof to the output /Q of the flip-flop 100b, at the other of the input terminals thereof to the frequency dividing ratio control signal line, and at the output terminal thereof to the input D of the flip-flop 125. The NAND gate 120 outputs a logic NAND between the output /Q of the flip-flop 100b and the frequency dividing ratio control signal MC.

The flip-flop 125 is connected at the output Q thereof to one of the input terminals of the NAND gate 110, and at the clock input CK thereof to the clock signal line. The flip-flop 125 latches the output from the NAND gate 120 in accordance with the pulse of the clock signal.

The NAND gate 110 is connected at one of the input terminals thereof to the output Q of the flip-flop 125, at the other of the input terminals thereof to the output Q of the flip-flop 100b, and at the output terminal thereof to the input D of the flip-flop 100a. The NAND gate 110 outputs a logic NAND between the output from the flip-flop 125 and the output Q from the flip-flop 100b.

The flip-flop 100a is connected at the input D thereof to the output terminal of the NAND gate 110, at the output Q thereof to the input D of the flip-flop 100b, and at the clock input CK to the clock signal line. The flip-flop 100b is connected at the input D thereof to the output Q of the flip-flop 100a, at the output Q thereof to the input terminal of the NAND gate 110 and the frequency divided signal line, and at the clock input terminal CK to the clock signal line. The flip-flops 100a-100b are cascaded as described above, so as to sequentially latch the output from the NAND gate 110 in accordance with the pulse of the clock signal FCLK and pass the latch result to the outputs.

Figures 2A, 2B:
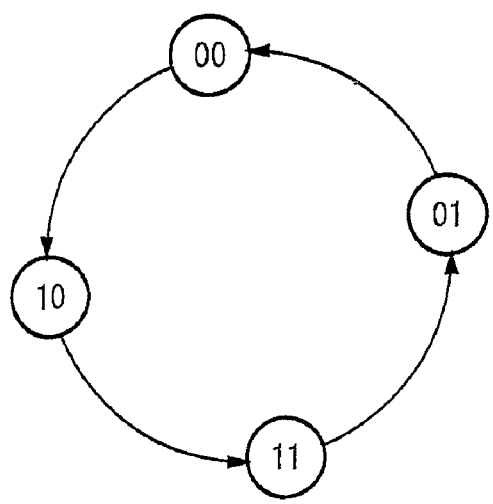
FIG. 2A illustrates, by using a table, the state transition of the frequency dividing circuit 10 which is observed when a frequency dividing ratio control signal indicates the logic value "0".
FIG. 2B illustrates, by using a drawing, the state transition of the frequency dividing circuit 10 which is observed when the frequency dividing ratio control signal indicates the logic value "0".

FIGS. 2A and 2B are respectively a table and a drawing illustrating the state transition of the frequency dividing circuit 10 which is observed when the frequency dividing ratio control signal MC indicates the logic value "0". When the frequency dividing ratio control signal MC indicates the logic value "0", the first frequency dividing ratio indicating ¼ is selected.

When the frequency dividing ratio control signal MC indicates the logic value "0", the output from the NAND gate 120 indicates the logic value "1" irrespective of the logic value indicated by the output Q of the flip-flop 100b, and the output Q of the flip-flop 125 indicates the logic value "1" after the clock signal FCLK is input at least once. Therefore, the NAND gate 110 inverts the output Q of the flip-flop 100b, and inputs the inverted output Q to the input D of the flip-flop 100a. As a result, the state of the frequency dividing circuit 10 transits in such a manner that the combination of the logic values indicated by the outputs Q of the flip-flops 100a and 100b varies in the order of (0, 0), (1, 0), (1, 1), (0, 1) and (0, 0) in accordance with the input of each pulse of the clock signal FCLK. Here, the frequency divided signal DIVCLK is the same as the output Q of the flip-flop 100b. Therefore, the logic value of the frequency divided signal DIVCLK varies in the order of 0, 0, 1 and 1 during four periods of the clock signal FCLK.

Figures 3A, 3B:
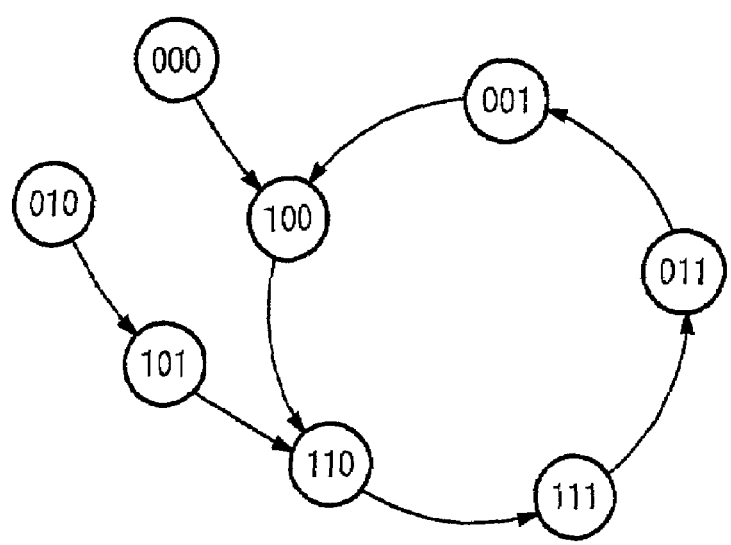
FIG. 3A illustrates, by using a table, the state transition of the frequency dividing circuit 10 which is observed when the frequency dividing ratio control signal indicates the logic value "1".
FIG. 3B illustrates, by using a drawing, the state transition of the frequency dividing circuit 10 which is observed when the frequency dividing ratio control signal indicates the logic value "1".

FIGS. 3A and 3B are respectively a table and a drawing illustrating the state transition of the frequency dividing circuit 10 which is observed when the frequency dividing ratio control signal MC indicates the logic value of "1". When the frequency dividing ratio control signal MC indicates the logic value of "1", the second frequency dividing ratio indicating ⅕ is selected.

When the logic value of the frequency dividing ratio control signal MC is "1", the NAND gate 120 inverts the output /Q of the flip-flop 100b and inputs the inverted output /Q into the input D of the flip-flop 125. Consequently, the flip-flop 125 obtains the inverted value of the output /Q of the flip-flop 100b (in other words, the same value as the output Q) in accordance with the clock signal FCLK, and feeds the obtained value back to the NAND gate 110. The signal fed from the flip-flop 125 back to the NAND gate 110 functions as a pulse swallow signal. Therefore, the state of the frequency dividing circuit 10 transits in such a manner that the combination of the logic values indicated by the outputs Q of the flip-flops 100a, 100b and 125) varies in the order of (0, 0, 1), (1, 0, 0), (1, 1, 0), (1, 1, 1), (0, 1, 1) and (0, 0, 1) in accordance with the input of each pulse of the clock signal FCLK. As a result, the logic value of the frequency divided signal DIVCLK varies in the order of 0, 0, 1, 1, and 1 during five periods of the clock signal FCLK.

Figure 4:
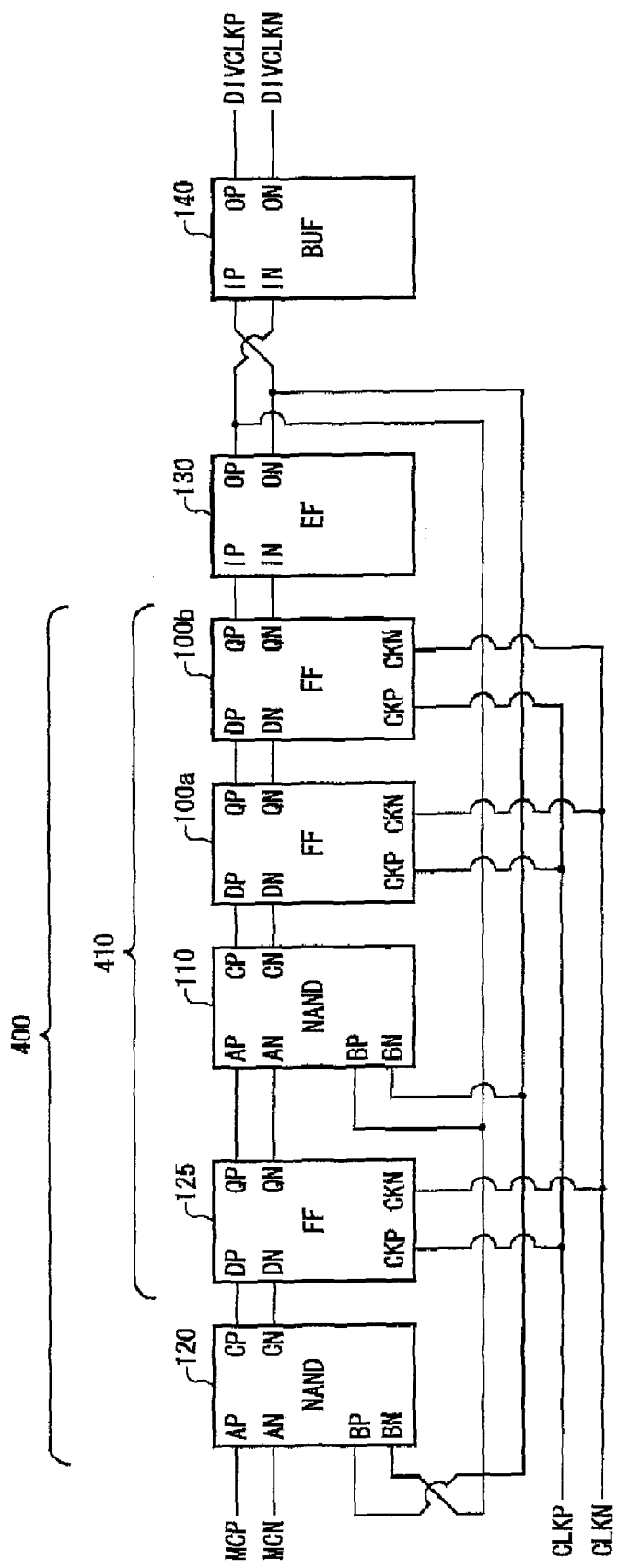
FIG. 4 illustrates the detailed configuration of the frequency dividing circuit 10.

FIG. 4 illustrates the detailed configuration of the frequency dividing circuit 10. According to the present embodiment, each constituent in the frequency dividing circuit 10 is realized by using a differential circuit. The configuration illustrated in FIG. 4 is substantially the same as the configuration illustrated in FIG. 1, except that FIG. 4 specifically illustrates how the respective constituents shown in FIG. 1 are connected to each other in the case of differential signaling and additionally shows a current amplifying circuit 130 and a buffer circuit 140. Therefore, the following explanation of FIG. 4 mainly attaches a focus on the differences and does not mention the similarities. It should be noted hereinafter that the positive-side signal of the differential signal is distinguished by the letter "P" attached at the end thereof, and the negative-side signal of the differential signal is distinguished by the letter "N" attached at the end thereof.

The frequency dividing circuit 10 includes therein a logic circuit 400 that is constituted by the NAND gate 120, the flip-flop 125, the NAND gate 110 and the flip-flops 100a-100b shown in FIG. 1, the current amplifying circuit 130, and the buffer circuit 140. The logic circuit 400 operates in accordance with a frequency dividing ratio control signal (the signals MCP and MCN) which is a differential signal and input from outside, and a logic signal (the signals OP and ON) which is a differential signal and output from the current amplifying circuit 130. The logic circuit 400 includes therein the NAND gate 120 and a sequential circuit 410 containing therein the flip-flop 125, NAND gate 110, and flip-flops 100a-100b.

The NAND gate 120 receives the differential frequency dividing ratio control signal (MCP and MCN) via the differential input terminals AP and AN, receives the differential logic signal (OP and ON) output from the current amplifying circuit 130 via the differential input terminals BP and BN, and outputs the result of a logic operation which is performed on the received logic signals in the form of a differential logic signal (the signals CP and CN). The sequential circuit 410 is positioned adjacent to the NAND gate 120. The sequential circuit 410 operates in accordance with the result of the logic operation performed by the NAND gate 120, and outputs a logic signal corresponding to the result of the operation performed therein to the current amplifying circuit 130. It should be noted here that the NAND gate 110 outputs a logical NAND between the output from the flip-flop 125 and the output from the current amplifying circuit 130 (that is to say, a logic signal obtained by amplifying the outputs QP and QN from the flip-flop 100b).

The current amplifying circuit 130 amplifies the current of the differential logic signal output from the logic circuit 400 (that is to say, the outputs QP and QN from the flip-flop 100b), and feeds the current-amplified logic signal back to the NAND gates 120 and 110. Here, the output OP from the current amplifying circuit 130 which corresponds to the output QP from the flip-flop 100b is input into the negative-side input BN of the NAND gate 120, and the output ON from the current amplifying circuit 130 which corresponds to the output QN from the flip-flop 100b is input into the positive-side input BP of the NAND gate 120. As mentioned above, the positive-side and negative-side signals of the differential signal are interchanged between the current amplifying circuit 130 and NAND gate 120, so that the outputs OP and ON from the current amplifying circuit 130 are inverted and then input into the NAND gate 120. In this way, a differential signal corresponding to the output /Q is input into the NAND gate 120. In the present embodiment, the current amplifying circuit 130 is positioned adjacent to one of the sides of the sequential circuit 410 which is opposite to the side to which the NAND gate 120 is adjacent. In other words, the NAND gate 120 and current amplifying circuit 130 are arranged so as to sandwich the sequential circuit 410 therebetween. In more detail, the NAND gate 120 is adjacent to the input terminal side of the sequential circuit 410, and the current amplifying circuit 130 is adjacent to the output terminal side of the sequential circuit 410, which is opposite to the input terminal side.

The buffer circuit 140 buffers and voltage-amplifies the outputs OP and ON from the current amplifying circuit 130, and resultantly outputs a differential frequency divided signal (the signals DIVCLKP and DIVCLKN). According to the present embodiment, the buffer circuit 140 receives at the input IN thereof the output OP from the current amplifying circuit 130 and receives at the input IP the output ON from the current amplifying circuit 130, to invert the logic value and output the inverted logic value via the outputs OP and ON. In this way, the buffer circuit 140 can output the frequency divided signal DIVCLK which indicates the same logic value as the output Q from the flip-flop 100b.

As described above, the frequency dividing circuit 10 is configured in such a manner that the NAND gate 120 is positioned adjacent to the input terminal side of the sequential circuit 410, and the current amplifying circuit 130 is positioned adjacent to the output terminal side of the sequential circuit 410. To be more specific, in the frequency dividing circuit 10, the NAND gate 120, flip-flop 125, NAND gate 110, NAND gate 110a, NAND gate 110b, current amplifying circuit 130 and buffer circuit 140 are arranged in the stated order. With such a configuration, the wires connecting the respective constituents to each other are largely found between adjacent constituents. Here, the outputs QP and QN need to be fed back from the flip-flop 100b to the NAND gates 120 and 110. According to the present embodiment, the outputs QP and QN from the flip-flop 100b are first current-amplified by the current amplifying circuit 130, and then fed back to the NAND gates 120 and 110. In this way, the short switching time can be maintained even though the outputs QP and QN are transmitted through relatively long wires. As a result, the frequency dividing circuit 10 is capable of operating at a high speed, thereby being capable of dividing the frequency of the clock signal FCLK having a high frequency.

Figure 5:
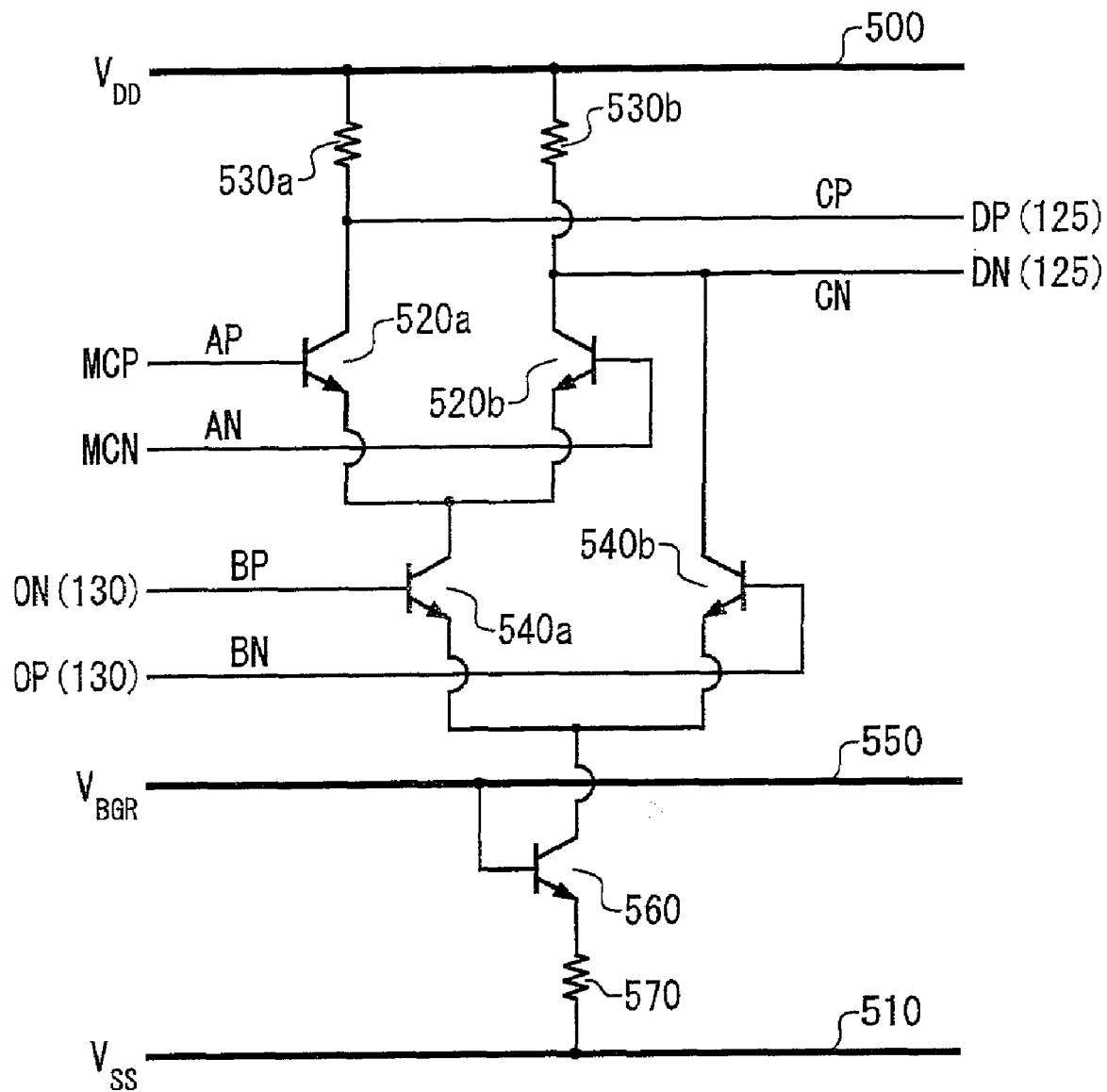
FIG. 5 is an exemplary circuit diagram illustrating a NAND gate 120.

FIG. 5 is an exemplary circuit diagram illustrating the NAND gate 120. Since the NAND gates 120 and 110 have a similar configuration, the following does not describe the NAND gate 110 except for its differences from the NAND gate 120. The NAND gate 120 includes therein transistors 520a-520b, resistances 530a-530b, a transistor 540a, a transistor 540b, a reference voltage wire 550, a transistor 560, and a resistance 570. The transistors 520a-520b are shown as an example of a first transistor, the transistor 540a is shown as an example of a second transistor, and the transistor 540b is shown as a fourth transistor. The NAND gate 120 calculates a logical NAND between the frequency dividing ratio control signal MC input into the bases of the transistors 520a-520b and the logic signal which is output from the current amplifying circuit 130 and input into the bases of the transistors 540a-540b, and outputs the logical NAND to the flip-flop 125 included in the sequential circuit 410.

Each of the transistors 520a-520b is connected in series to the transistor 540a between a high power supply wire 500 and a low power supply wire 510 in such a manner that the emitter of each of the transistors 520a-520b is connected to the collector of the transistor 540a. The transistors 520a-520b are positioned closer to the high power supply wire 500, and the transistor 540a is positioned closer to the low power supply wire 510.

The transistors 520a-520b form a differential pair. The transistor 520a receives at the base thereof a positive-side signal AP of the differential signal input into the input terminal A of the NAND gate 120 (the positive-side frequency dividing ratio control signal MCP). The transistor 520b receives at the base thereof a negative-side signal AN of the same differential signal (the negative-side frequency dividing ratio control signal MCN). Each of the resistances 530a-530b is connected so as to be positioned between the high power supply wire 500 and a corresponding one of the transistors 520a-520b. The potential between the resistance 530a and the transistor 520a and the potential between the resistance 530b and the transistor 520b are output as a positive-side signal CP and a negative-side signal CN which form a differential signal output from the NAND gate 120.

The transistors 540a-540b form a differential pair. The transistor 540a has a collector connected to the emitters of the transistors 520a and 520b, and receives at the base thereof one of the positive-side logic signal OP and the negative-side logic signal ON which are output from the current amplifying circuit 130 (in the present embodiment, the negative-side logic signal ON). The transistor 540b has a collector which is connected to the collector of one of the transistors 520a and 520b (in the present embodiment, the transistor 520b) so as to have the same potential as the collector of the transistor 520. The emitter of the transistor 540b is connected to the emitter of the transistor 540a. The transistor 540b receives at the base thereof the other of the positive-side logic signal and the negative-side logic signal from the current amplifying circuit 130 (in the present embodiment, the positive-side logic signal OP).

The reference voltage wire 550, transistor 560, and resistance 570 together function as a constant current source which defines the current flowing from the differential pair to the low power supply wire 510. The referential voltage wire 550 supplies, to the base of the transistor 560, a reference voltage which is used to set the current flowing from the transistor 560 and resistance 570 to the low power supply wire 510. This reference voltage is determined in advance by, for example, a designer of a circuit including the frequency dividing circuit 10, based on the current which is required to flow through the transistor 560 and resistance 570.

The transistor 560 is connected so as to be positioned between the low power supply wire 510 and the emitters of the transistors 540a and 540b. The transistor 560 receives the reference voltage supplied from the reference voltage wire 550 as the base voltage thereof. The emitter potential of the transistor 560 is set equal to a value obtained by subtracting, from the base voltage, the base-emitter voltage which is determined in advance by the characteristic of the transistor 560. The resistance 570 is connected in series to the transistor 560 between the transistor 560 and the low power supply wire 510. The resistance 570 causes a current, which is determined by the resistance value of the resistance 570 and a difference in potential between the emitter of the transistor 560 and the low power supply wire 510, to flow from the transistor 560 to the low power supply wire 510.

The NAND gate 120 operates in the following manner. A case is assumed where the input A indicates the logic value "0" and the input B indicates the logic value "0" (AP="L", AN="H", BP="L", and BN="H"). In this case, while the transistor 540a is turned off (high resistance) so that the currents flowing through the transistors 520a and 520b decrease or become substantially zero, the transistor 540b is turned on (low resistance). Therefore, the connection between the output CP and the low power supply wire 510 is cut off, and the output CP thus indicates "H". The output CN is connected to the low power supply wire 510 via the transistor 540b so as to have a lower potential than the output CP. Thus, the output CN indicates "L".

A case is assumed where the input A indicates the logic value "0" and the input B indicates the logic value "1" (AP="L", AN="H", BP="H", and BN="L"). In this case, while the transistors 520a and 540b are turned off, the transistors 520b and 540a are turned on. Therefore, the connection between the output CP and the low power supply wire 510 is cut off, and the output CP thus indicates "H". On the other hand, the output CN is connected to the low power supply wire 510 via the transistors 520b and 540a so as to have a lower potential than the output CP. Thus, the output CN indicates "L".

A case is assumed where the input A indicates the logic value "1" and the input B indicates the logic value "0" (AP="H", AN="L", BP="L", and BN="H"). In this case, while the transistor 540a is turned off so that the currents flowing through the transistors 520a-520b decrease or become substantially zero, the transistor 540b is turned on. Therefore, the connection between the output CP and the low power supply wire 510 is cut off, and the output CP thus indicates "H". The output CN is connected to the low power supply wire 510 via the transistor 540b so as to have a lower potential than the output CP. Thus, the output CN indicates "L".

A case is assumed where the input A indicates the logic value "1" and the input B indicates the logic value "1" (AP="H", AN="L", BP="H", and BN="L"). In this case, while the transistors 520b and 540b are turned off, the transistors 520a and 540a are turned on. Therefore, the output CP is connected to the low power supply wire 510 via the transistors 520a and 540a so as to have a lower potential than the output CN. Thus, the output CP indicates "L". On the other hand, the connection between the output CN and the low power supply wire 510 is cut off, and the output CN thus indicates "H".

As described above, the NAND gate 120 functions as a NAND circuit whose output C indicates the logic value "0" when the inputs A and B both indicate the logic value "1".

According to the present embodiment, the high power supply wire 500 may supply 0V, the reference voltage wire 550 may supply −2.1V, and the low power supply wire 510 may supply −3.3V, for example. The collector of each of the transistors 520a-520b is the first collector which is connected to the high power supply wire 500 (in other words, connected as the first stage when seen from the high power supply wire 500). When the differential signal input into the transistors 520a-520b has the "H" level of 0V and the "L" level of −0.2V, the transistors cause a voltage drop of −0.9V, for example. Therefore, the emitter potentials of the transistors are lowered to −0.9V and −1.1V. Here, the collector of the transistor 540*a* is connected as the second stage when seen from the high power supply wire 500. The transistor 540*a* therefore further generates a voltage drop of −0.9V.

According to the present embodiment, the transistor 540*b* is connected so as to be positioned between the collector of the transistor 520*b* and the lower power supply wire 510. Therefore, the collector of the transistor 540*b* is connected as the first stage when seen from the high power supply wire 500. In the case of transistors forming a differential pair, a dummy self-biased transistor is generally added when required in order to achieve the same number of stages when seen from the high power supply wire 500 between the transistors. According to the present embodiment, such dummy transistors are not provided. Instead, the collector of the transistor 540*b* is directly connected to the collector of the transistor 520*b*. In this way, the present embodiment reduces the capacitance load of the NAND gate 120.

Figure 6:
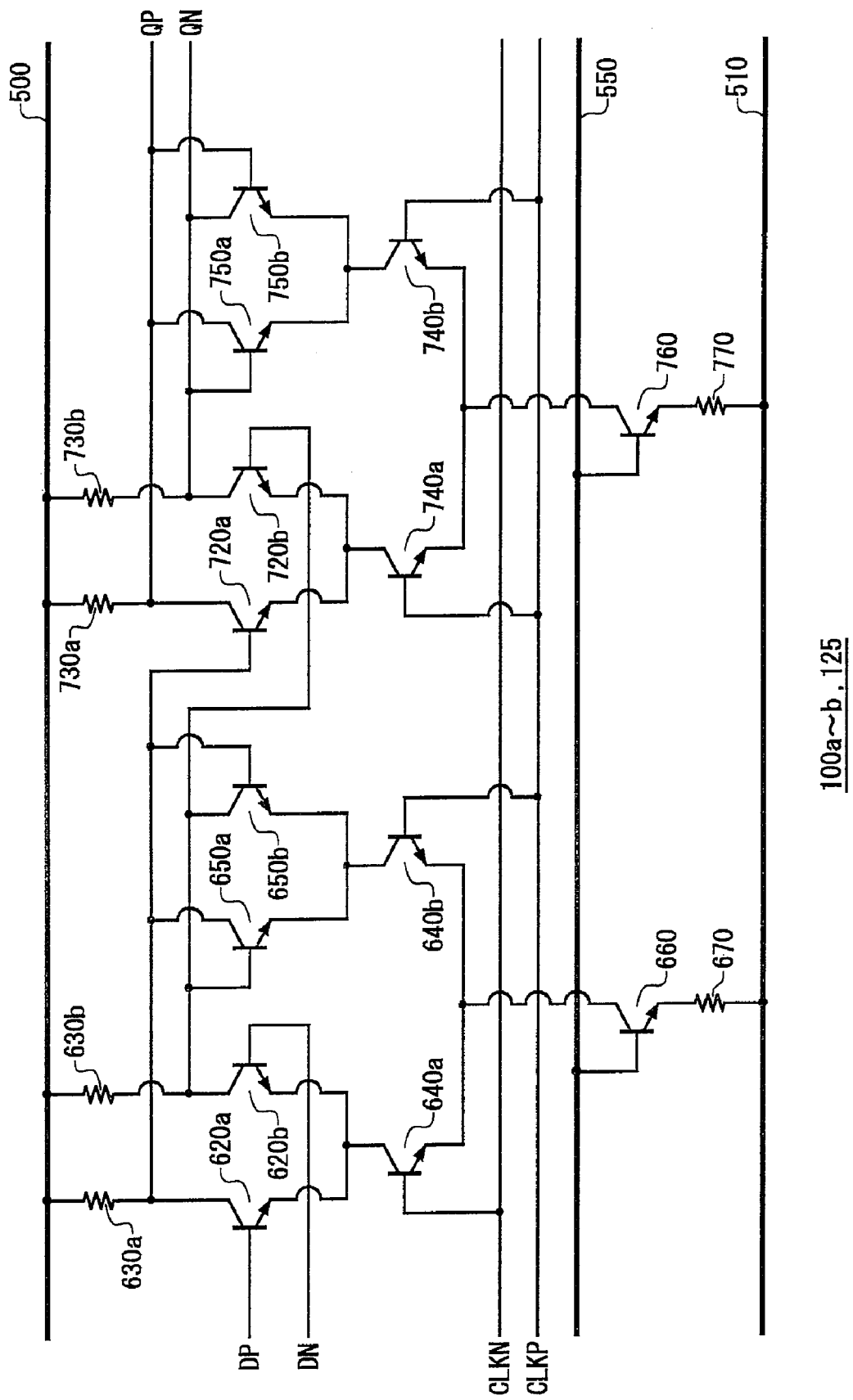
FIG. 6 is an exemplary circuit diagram illustrating flip-flops (FF) 100a-100b and a flip-flop 125.

FIG. 6 is an exemplary circuit diagram illustrating the flip-flops 100*a*-100*b* and flip-flop 125. The flip-flops 100*a*-100*b* and flip-flop 125 include therein transistors 620*a*-620*b*, resistances 630*a*-630*b*, transistors 640*a*-640*b*, transistors 650*a*-650*b*, a transistor 660, a resistance 670, transistors 720*a*-720*b*, resistances 730*a*-730*b*, transistors 740*a*-740*b*, transistors 750*a*-750*b*, a transistor 760 and a resistance 770.

The transistors 620*a*-620*b* form a differential pair. The collectors of the transistors 620*a*-620*b* are connected to the high power supply wire 500 via the resistances 630*a*-630*b*, and the bases of the transistors 620*a*-620*b* are connected to the inputs DP and DN. The transistors 640*a*-640*b* form a differential pair. The transistor 640*a* is connected in such a manner that the collector thereof is connected to the transistors 640*a*-640*b* and the emitter thereof is connected to the transistor 660. The base of the transistor 640*a* is connected to the clock input CLKN. On the other hand, the transistor 640*b* is connected in such a manner that the collector thereof is connected to the transistors 650*a*-650*b* and the emitter thereof is connected to the transistor 660. The base of the transistor 640*b* is connected to the clock input CLKP.

The transistors 650*a*-650*b* form a differential pair. The collector of each of the transistors 650*a*-650*b* is connected to the collector of the transistor 620*a* and the emitter of each of the transistors 650*a*-650*b* is connected to the transistor 640*b*. The base of each of the transistors 650*a* and 650*b* is connected to the collector of the transistor 620*b*. The transistor 660 and resistance 670 are respectively the same as the transistor 560 and resistance 570.

The transistors 720*a*-720*b*, resistances 730*a*-730*b*, transistors 740*a*-740*b*, transistors 750*a*-750*b*, transistor 760, and resistance 770 are substantially the same as the transistors 620*a*-620*b*, resistances 630*a*-630*b*, transistors 640*a*-640*b*, transistors 650*a*-650*b*, transistor 660 and resistance 670 respectively, and are thus not described except for their differences. The transistor 720*a* receives at the base thereof the voltage between the transistor 620*a* and the resistance 630*a*, and the transistor 720*b* receives at the base thereof the voltage between the transistor 620*b* and the resistance 630*b*. The transistor 720*a* outputs the voltage between the transistor 720*a* and the resistance 730*a* as a signal QP, and the transistor 720*b* outputs the voltage between the transistor 720*b* and the resistance 730*b* as a signal QN, where the signals QP and QN form a differential logic signal. The transistor 740*a* receives at the base thereof the clock input CLKP, and the transistor 740*b* receives at the base thereof the clock input CLKN.

The flip-flops 100*a*-100*b* and flip-flop 125 operate in the following manner. When the clock input CLKP falls and the clock input CLKN rises in the later half of a given cycle (cycle 1), the transistor 640*a* is turned on and the transistor 640*b* is turned off. Therefore, the voltage between the resistance 630*a* and the transistor 620*a* and the voltage between the resistance 630*b* and the transistor 620*b* respectively indicate the values determined in accordance with the voltages of the inputs DP and DN (the logic value obtained by inverting the input D, referred to as the logic value /D1).

When the clock input CLKP rises and the clock input CLKN falls in the former half of the next cycle (cycle 2), the transistor 640*a* is turned off and the transistor 640*b* is turned on, so that the transistors 650*a*-650*b* obtain the logic value /D1. Also, the transistor 740*a* is turned on and the transistor 740*b* is turned off, so that the logic value D1, which is obtained by inverting the logic value /D1 obtained by the transistors 650*a*-650*b*, is supplied to the transistors 750*a*-750*b* and to the outputs QP and QN.

When the clock input CLKP falls and the clock input CLKN falls in the later half of the cycle 2, the transistor 740*a* is turned off and the transistor 740*b* is turned on. As a result, the logic value D1 between the resistances 730*a*-730*b* and the transistors 720*a*-720*b* is obtained and kept by the transistors 750*a*-750*b* until the start timing of the next cycle. In the above-described manner, the flip-flops 100*a*-100*b* and flip-flop 125 obtain the inputs DP and DN at the start timing of each cycle, and keep the obtained inputs DP and DN until the start timing of the next cycle.

Figure 7:
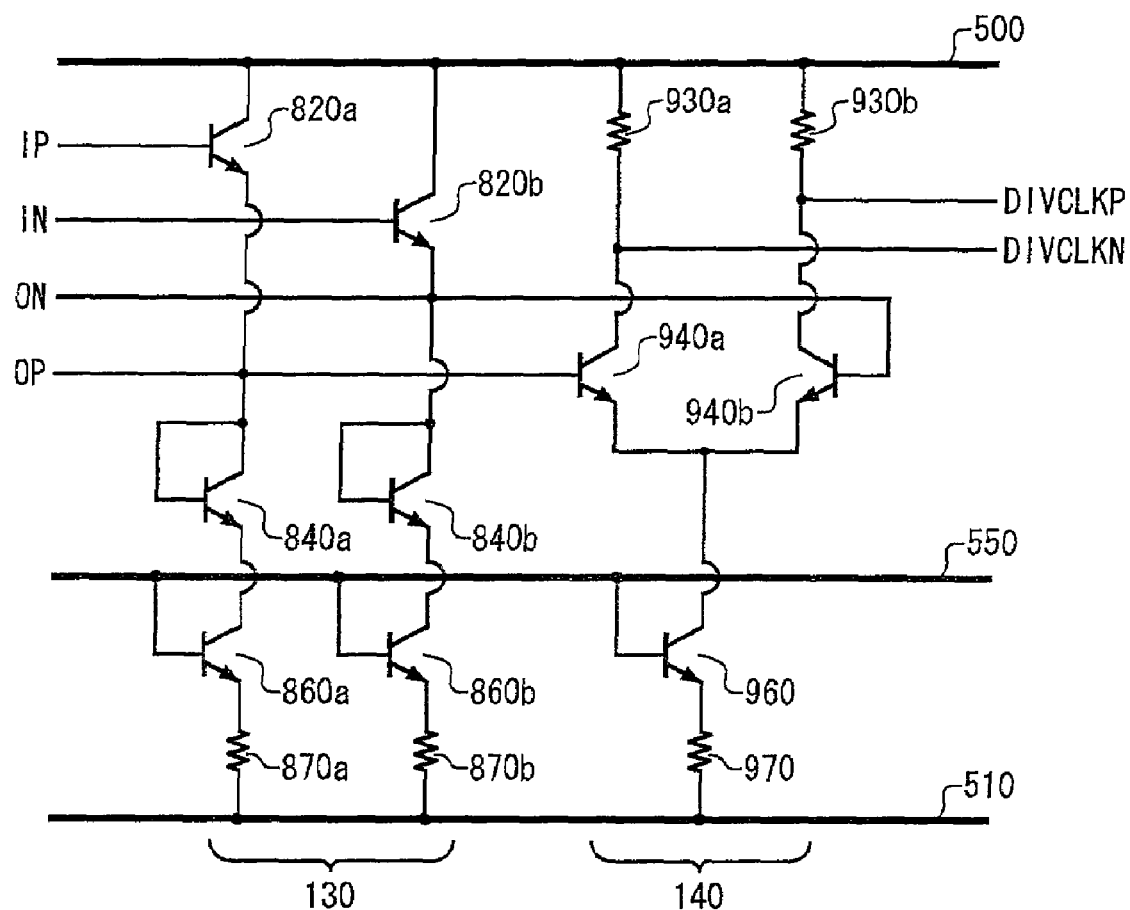
FIG. 7 is an exemplary circuit diagram illustrating a current amplifying circuit 130 and a buffer circuit 140.

FIG. 7 is an exemplary circuit diagram illustrating the current amplifying circuit 130 and buffer circuit 140. The current amplifying circuit 130 includes therein transistors 820*a*-820*b*, transistors 840*a*-840*b*, transistors 860*a*-860*b*, and resistances 870*a*-870*b*. The current amplifying circuit 130 receives the logic signal output from the logic circuit 400 via the inputs IP and IN thereof, amplifies the current of the received logic signal, and outputs the resulting signal via the outputs OP and ON.

The transistors 820*a*-820*b* are shown as an example of a third transistor relating to the present invention, and function as an emitter follower. Referring to each of the transistors 820*a*-820*b*, the collector is connected to the high power supply wire 500, the emitter is connected to the low power supply wire 510, and the base is connected to the output from the logic circuit 400. To be more specific, the transistor 820*a* receives at the base thereof the positive-side logic signal output from the logic circuit 400, and outputs the positive-side signal of a differential logic signal from the emitter thereof as the output OP. The transistor 820*b* receives at the base thereof the negative-side logic signal output from the logic circuit 400, and outputs the negative-side signal of the differential logic signal from the emitter thereof as the output ON.

Referring to each of the transistors 840*a*-840*b*, the collector is connected to a corresponding one of the transistors 820*a*-820*b*, the emitter is connected to the high power supply wire 500, and the base receives the collector voltage. In this way, the transistors 840*a*-840*b* are self-biased. Therefore, the potential of the emitter of each of the transistors 840*a*-840*b* is set equal to the value obtained by reducing the voltage (for example, 0.9V) which is determined by the characteristics of each of the transistors 840*a*-840*b* from the potential of the collector. According to the present embodiment, the transistors 840*a*-840*b* are connected so as to be positioned between the transistors 820*a*-820*b* and the transistors 860*a*-860*b*, so as to function as the transistors of the second stage when seen from the high power supply wire 500. The transistors 860*a*-860*b* and resistances 870*a*-870*b* have similar functions and configurations to the transistor 560 and resistance 570 which are described with reference to FIG. 5, and are thus not described here.

The following describes how the current amplifying circuit 130 operates. The transistors 820a-820b output, from the emitters thereof, the voltages obtained by reducing the voltage which is determined by the characteristics of the transistors 820a-820b (for example, 0.9V) from the voltages of the inputs IP and IN into the bases thereof. Therefore, the outputs OP and ON from the current amplifying circuit 130 indicate the same logic values as the inputs IP and IN into the current amplifying circuit 130. However, the voltages of the outputs OP and ON are lower than the voltages of the inputs IP and IN by an amount determined by the characteristics of the transistors 820a and 820b.

The buffer circuit 140 is positioned adjacent to one of the sides of the logic circuit 400 which is opposite to the side at which the NAND gate 120 is positioned. The buffer circuit 140 includes therein resistances 930a-930b, transistors 940a-940b forming a differential pair, a transistor 960, and a resistance 970. The buffer circuit 140 buffers the current-amplified signal which is input thereto from the current amplifying circuit 130, and outputs the current-amplified signal as the frequency divided signal (DIVCLKP and DIVCLKN). The resistance 930a is connected in series to the high power supply wire 500 and the transistor 940a so as to be positioned therebetween, and the resistance 930b is connected in series to the high power supply wire 500 and the transistor 940b so as to be positioned therebetween. In the transistors 940a-940b, the collectors are connected to the high power supply wire 500, the emitters are connected to the transistor 960, and the bases respectively receive the outputs from the transistors 820a-820b. The transistor 960 and resistance 970 have similar functions and configurations to the transistor 560 and resistance 570 which are described with reference to FIG. 5, and are therefore not described here.

When the outputs OP and ON from the current amplifying circuit 130 respectively indicate "L" and "H", the transistor 940a is turned off and the transistor 940b is turned on. Therefore, the frequency divided signal DIVCLKN is dominantly influenced by the current flowing into the low power supply wire 510 via the transistor 940a, transistor 960, and resistance 970, and the potential of the frequency divided signal DIVCLKN decreases. On the other hand, the frequency divided signal DIVCLKP is dominantly influenced by the current flowing from the high power supply wire 500 into the transistor 940b via the resistance 930b, and the potential of the frequency divided signal DIVCLKP increases. As a result, the buffer circuit 140 sets the frequency divided signal DIVCLKP to indicate the logic value "H", and sets the frequency divided signal DIVCLKN to indicate the logic value "L".

When the outputs OP and ON from the current amplifying circuit 130 respectively indicate "H" and "L", the positive-side and negative-side constituents of the buffer circuit 140 operate in an opposite manner to the operations performed in the case described above. As a result, the buffer circuit 140 sets the frequency divided signal DIVCLKP to indicate the logic value "L", and sets the frequency divided signal DIVCLKN to indicate the logic value "H".

According to the above-described configuration, the collector of each of the transistors 820a-820b is positioned as the first stage when seen from the high power supply wire 500. Here, the bases of the transistors 820a-820b are connected to the high power supply wire 500 via the resistances 730a-730b of the flip-flop 100b. Therefore, the base of each of the transistors 820a and 820b is also positioned as the first stage when seen from the high power supply wire 500.

Here, the transistors 820a-820b cause a voltage drop. Therefore, the potentials (the emitter potentials) of the outputs OP and ON from the transistors 820a-820b are lower than the potentials (the base potentials) of the inputs IP and IN into the transistors 820a and 820b. For this reason, when the outputs OP and ON from the transistors 820a-820b are further connected to the bases of different transistors, the voltages generated as a result of a voltage drop occurring in the voltages at the bases of the transistors 820a-820b are input into the bases of the different transistors. Therefore, the bases of the different transistors are positioned at the second stage when seen from the high power supply wire 500.

For example, it is assumed that the outputs OP and ON from the current amplifying circuit 130 are input into the bases of the transistors 520a-520b so as to be fed back to the NAND gate 120. In this case, the transistors 820a-820b are positioned at the first stage, the transistors 520a-520b are positioned at the second stage, and the transistors 540a-540b are positioned at the third stage, when seen from the high power supply wire 500. When the frequency dividing circuit 10 is configured in this manner, the number of stages of the transistors positioned between the high and low power supply wires 500 and 510 becomes large.

To deal with this issue, the outputs OP and ON from the emitters of the transistors 820a-820b are fed back to the base of the transistor 540a which is positioned at the second stage within the NAND gate 120, according to the present embodiment. In addition, the transistors 820a-820b which are positioned at the first stage within the NAND gate 120 receive the frequency dividing ratio control signal MCP and MCN. Here, no transistors are provided between the transistors 520a-520b and the high power supply wire 500. When the frequency dividing circuit 10 is configured in the above-described manner, the voltage range of the logic signal input into the base of the transistor 540a is positioned lower than the voltage range of the logic signal input into the bases of the transistors 520a-520b and the bases of the transistors 820a-820b. With such a configuration, the transistor 540a is positioned at the second stage in terms of the input into the base thereof and the collector thereof. As a result, the present embodiment can reduce the number of stages of transistors between the high and low power supply wires 500 and 510.

Figure 8:
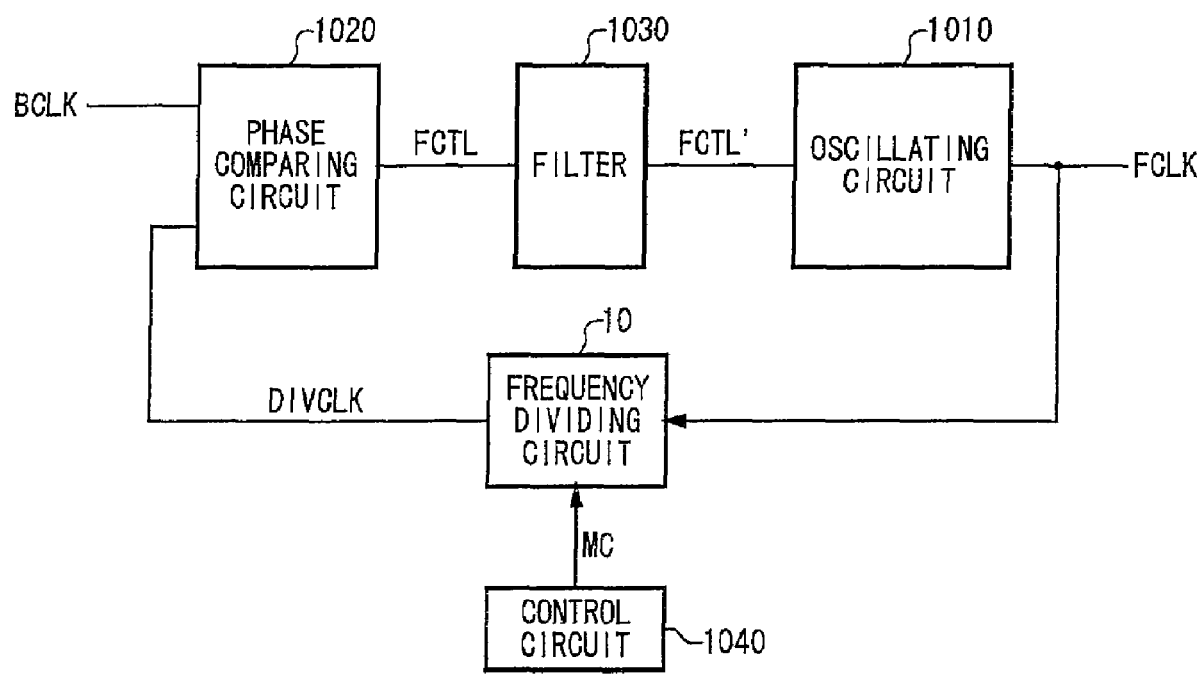
FIG. 8 illustrates an example of an oscillating apparatus 1000 relating to an embodiment of the present invention.

FIG. 8 illustrates an example of an oscillating apparatus 1000 relating to an embodiment of the present invention. The oscillating apparatus 1000 includes therein an oscillating circuit 1010, the frequency dividing circuit 10, a phase comparing circuit 1020, a filter 1030, and a control circuit 1040.

The oscillating circuit 1010 is, for example, a voltage controlled oscillator (VCO), and outputs a clock signal FCLK which is an oscillating signal generated based on a frequency control signal FCTL' input thereto. The frequency dividing circuit 10 has the function and configuration described with reference to FIGS. 1 to 7, and outputs the frequency divided signal DIVCLK, which is obtained by dividing the frequency of the oscillating signal output from the oscillating circuit 1010.

The phase comparing circuit 1020 compares the frequency divided signal DIVCLK and a reference clock BCLK to each other in terms of phase, and supplies to the oscillating circuit 1010 a frequency control signal FCTL to bring the detected phase difference closer to a predetermined value. For example, when the phase of the frequency divided signal DIVCLK is ahead of the phase of the reference clock BCLK, the phase comparing circuit 1020 varies the value of the frequency control signal FCTL in such a manner as to decrease the oscillating frequency of the oscillating circuit 1010. On the other hand, when the phase of the frequency divided signal DIVCLK is behind the phase of the reference clock BCLK, the phase comparing circuit 1020 varies the value of the frequency control signal FCTL in such a manner as to increase the oscillating frequency of the oscillating circuit 1010.

The filter 1030 is a low pass filter, for example. The filter 1030 cuts off the high frequency component of the frequency control signal FCTL, and passes the low frequency component. The filter 1030 supplies, as the filtered frequency control signal FCTL', the resulting signal to the oscillating circuit 1010. The control circuit 1040 receives designation of the frequency for the oscillating signal FCLK which is expected to be generated by the oscillating apparatus 1000, and controls the frequency dividing ratio control signal MC so as to cause the oscillating signal FCLK to have the designated frequency. To be more specific, the control circuit 1040 controls the ratio between the cycles in which the frequency dividing ratio control signal MC indicates the logic value "0" so as to designate the frequency dividing ratio of ¼and the cycles in which the frequency dividing ratio control signal MC indicates the logic value "1" so as to designate the frequency dividing ratio of ⅕. In this way, the control circuit 1040 controls the frequency dividing circuit 10 to employ an appropriate frequency dividing ratio between ¼and ⅕, thereby controlling the frequency of the oscillating signal FCLK.

The oscillating apparatus 1000 described above uses the frequency dividing circuit 10 which is capable of operating at a high speed, thereby being capable of generating the clock signal FCLK of high frequency.

While an aspect of the present invention has been described through the embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

When used herein, the term "transistor" includes FETs, MOSFETs, HEMTs and the like. In compliance with the use of the term "transistor", the above description is made with terms such as "base", "collector", "emitter" and the like. However, the person skilled in the art apparently realizes that these terms can be replaced with "gate", "drain", "source" and the like in the case of the use of the term "FET".

As is apparent from the above description, an embodiment of the present invention can realize a circuit including therein a logic circuit and a current amplifying circuit that amplifies the current of the signal output from the logic circuit and efficiently feeds the current-amplified signal back to the logic circuit, and an oscillating apparatus which uses this circuit as a frequency dividing circuit.

What is claimed is:

1. A circuit comprising:
    a logic circuit that includes therein a first transistor and a second transistor which are connected in series to each other between a high power supply and a low power supply in such a manner that an emitter of one of the first and second transistors is connected to a collector of the other of the first and second transistors, the first transistor being positioned closer to the high power supply and the second transistor being positioned closer to the low power supply, the logic circuit operating in accordance with voltages input into respective bases of the first and second transistors; and
    a current amplifying circuit that includes therein a third transistor whose collector is connected to one of the high and low power supplies, whose emitter is connected to the other of the high and low power supplies, and whose base is connected to an output from the logic circuit, the current amplifying circuit amplifying a current of a logic signal output from the logic circuit and feeding, from the emitter of the third transistor, the current-amplified logic signal back to the base of the second transistor,
    wherein the logic circuit includes:
        a first logic gate circuit that includes therein the first and second transistors, the first logic gate circuit outputting a result of a logic operation performed based on logic signals input into the respective bases of the first and second transistors; and
        a sequential circuit that is positioned so as to be adjacent to the first logic gate circuit, the sequential circuit operating in accordance with the result of the logic operation performed by the first logic gate circuit, and outputting a logic signal determined in accordance with a result of the operation to the current amplifying circuit, and
    wherein the current amplifying circuit is positioned so as to be adjacent to a side of the sequential circuit which is opposite to a side to which the first logic gate circuit is adjacent.

2. The circuit as set forth in claim 1, wherein
    the logic circuit outputs a differential logic signal to the current amplifying circuit,
    the third transistor in the current amplifying circuit includes (i) a positive-side third transistor which receives at a base thereof a positive-side logic signal output from the logic circuit and (ii) a negative-side third transistor which receives at a base thereof a negative-side logic signal output from the current amplifying circuit, and the current amplifying circuit outputs a positive-side logic signal and a negative-side logic signal expressing a differential logic signal via emitters of the positive-side and negative-side third transistors, and
    the second transistor receives at the base thereof one of the positive-side and negative-side logic signals output from the current amplifying circuit.

3. The circuit as set forth in claim 2, wherein
    a voltage range of the logic signal input into the base of the second transistor is positioned lower than voltage ranges of logic signals input into the bases of the first and third transistors.

4. The circuit as set forth in claim 3, wherein
    the circuit is a frequency dividing circuit which divides a frequency of a clock signal input thereto in accordance with one of a first frequency dividing ratio and a second frequency dividing ratio which is selected by a frequency dividing ratio control signal input thereto, and outputs the frequency divided clock signal,
    the first logic gate circuit obtains a logical NAND between (i) the frequency dividing ratio control signal input into the base of the first transistor and (ii) the logic signal which is output from the current amplifying circuit and input into the base of the second transistor, and outputs the obtained logical NAND to the sequential circuit, and
    the sequential circuit includes:
        a first flip-flop that latches an output from the first logic gate circuit in accordance with a pulse of the clock signal;
        a second logic gate circuit that outputs a logical NAND between an output from the first flip-flop and an output from the current amplifying circuit; and one or more second flip-flops that sequentially latch an output from the second logic gate circuit in accordance with the pulse of the clock signal, and pass the latched result to an output thereof.

5. The circuit as set forth in claim 4, wherein the first logic gate circuit includes:
   the first transistor that includes two first transistors which respectively receive at bases thereof a positive-side frequency dividing ratio control signal and a negative-side frequency dividing ratio control signal expressing the frequency dividing ratio control signal;
   the second transistor that receives at the base thereof one of the positive-side and negative-side logic signals output from the current amplifying circuit; and
   a fourth transistor whose collector is connected to a collector of one of the two first transistors so as to have the same potential as the collector of the first transistor, whose emitter is connected to the emitter of the second transistor, and whose base receives the other of the positive-side and negative-side logic signals output from the current amplifying circuit.

6. An oscillating apparatus comprising:
   an oscillating circuit that outputs an oscillating signal in accordance with a frequency control signal;
   a frequency dividing circuit that outputs a frequency divided signal obtained by dividing a frequency of the oscillating signal; and
   a phase comparing circuit that compares the frequency divided signal and a reference clock to each other in terms of phase in order to detect a phase difference, and supplies to the oscillating circuit the frequency control signal to bring the detected phase difference closer to a predetermined value,
   wherein the frequency dividing circuit includes:
      a logic circuit that includes therein a first transistor and a second transistor which are connected in series to each other between a high power supply and a low power supply in such a manner that an emitter of one of the first and second transistors is connected to a collector of the other of the first and second transistors, the first transistor being positioned closer to the high power supply and the second transistor being positioned closer to the low power supply, the logic circuit operating in accordance with voltages input into respective bases of the first and second transistors and outputting the frequency divided signal obtained by dividing the frequency of the oscillating signal; and
      a current amplifying circuit that includes therein a third transistor whose collector is connected to one of the high and low power supplies, whose emitter is connected to the other of the high and low power supplies, and whose base is connected to an output from the logic circuit, the current amplifying circuit amplifying a current of the frequency divided signal and feeding, from the emitter of the third transistor, the current-amplified frequency divided signal back to the base of the second transistor,
   wherein the logic circuit includes:
      a first logic gate circuit that includes therein the first and second transistors, the first logic gate circuit outputting a result of a logic operation performed based on logic signals input into the respective bases of the first and second transistors; and
      a sequential circuit that is positioned so as to be adjacent to the first logic gate circuit, the sequential circuit operating in accordance with the result of the logic operation performed by the first logic gate circuit, and outputting a logic signal determined in accordance with a result of the operation to the current amplifying circuit, and
   wherein the current amplifying circuit is positioned so as to be adjacent to a side of the sequential circuit which is opposite to a side to which the first logic gate circuit is adjacent.

7. The oscillating apparatus as set forth in claim 6, wherein the frequency dividing circuit is a frequency dividing circuit which divides a frequency of a clock signal input thereto in accordance with one of a first frequency dividing ratio and a second frequency dividing ratio which is selected by a differential frequency dividing ratio control signal input thereto, and outputs the frequency divided clock signal, and
   the frequency dividing circuit includes:
      the first transistor that includes two first transistors which respectively receive at bases thereof a positive-side frequency dividing ratio control signal and a negative-side frequency dividing ratio control signal expressing the differential frequency dividing ratio control signal;
      the second transistor that receives at the base thereof one of a positive-side logic signal and a negative-side logic signal output from the current amplifying circuit; and
      a fourth transistor whose collector is connected to a collector of one of the two first transistors so as to have the same potential as the collector of the first transistor, whose emitter is connected to the emitter of the second transistor, and whose base receives the other of the positive-side and negative-side logic signals output from the current amplifying circuit.

\* \* \* \* \*